United States Patent [19]

Jarwala et al.

[11] Patent Number: 5,673,276
[45] Date of Patent: Sep. 30, 1997

[54] BOUNDARY-SCAN-COMPLIANT MULTI-CHIP MODULE

[75] Inventors: Najmi Taher Jarwala, Lawrenceville, N.J.; Chi Wang Yau, Yardley, Pa.

[73] Assignee: Lucent Technologies Inc., Murray Hill, N.J.

[21] Appl. No.: 716,559

[22] Filed: Feb. 5, 1996

Related U.S. Application Data

[63] Continuation of Ser. No. 172,778, Dec. 27, 1993, abandoned.

[51] Int. Cl.$^6$ .................................................. H04B 17/00
[52] U.S. Cl. ........................ 371/22.3; 371/22.1; 324/158.1
[58] Field of Search ............................. 371/22.1, 22.2, 371/22.3, 22.4, 22.5, 22.6; 324/73.1, 158.1

[56] References Cited

U.S. PATENT DOCUMENTS

| | | | |
|---|---|---|---|
| 4,855,669 | 8/1989 | Mahoney | 371/22.3 |
| 4,996,691 | 2/1991 | Wilcox et al. | 371/22.3 |
| 5,084,874 | 1/1992 | Whetsel, Jr. | 371/22.3 |
| 5,130,647 | 7/1992 | Sakashita et al. | 371/22.3 |
| 5,150,044 | 9/1992 | Hashizume et al. | 371/22.3 |
| 5,355,369 | 10/1994 | Greenberger et al. | 371/22.3 |
| 5,404,358 | 4/1995 | Russell | 371/22.3 |
| 5,412,260 | 5/1995 | Tsui et al. | 371/22.3 |
| 5,448,576 | 9/1995 | Russell | 371/22.3 |

OTHER PUBLICATIONS

"IEEE Standard Test Access Port and Boundary-Scan Architecture", IEEE Std. 1149.1–1990.

*Primary Examiner*—James P. Trammell
*Assistant Examiner*—Eric W. Stamber
*Attorney, Agent, or Firm*—Robert B. Levy; Steven R. Bartholomew

[57] ABSTRACT

A multi-chip module (10), having n semiconductor chips $14_1$–$14_n$, each chip having a Boundary-Scan architecture, is rendered Boundary-Scan-compliant both as a circuit board and as a macro-device by the addition of a bypass circuit (36, 36' and 36"). During selected intervals when the module (10) is to be Boundary-Scan-compliant as a macro-device, the bypass circuit operates to bypass the Test Data Input (18) to the Test Data Output (34) of each of n–1 chips. During other than the selected intervals, the bypass circuit allows test information applied to the Test Data Input of each of the chips to be shifted through the chip and to appear at its Test Data Output to facilitate Boundary-Scan compliance of the module as a circuit board.

5 Claims, 4 Drawing Sheets

BOUNDARY-SCAN-COMPLIANT MULTI-CHIP MODULE

This application is a continuation of application Ser. No. 08/172,778, filed on Dec. 27, 1993, now abandoned.

TECHNICAL FIELD

This invention relates generally to a multi-chip module that can be tested using the Boundary-Scan test technique.

BACKGROUND OF THE INVENTION

There is now a growing interest in multi-chip modules among manufacturers of electronic components and equipment. Such modules comprise a substrate (e.g., ceramic) having one or more semiconductor chips (and possibly, one or more passive components) mounted on one or both major surfaces of the substrate. The chips and passive components on the substrate are coupled to a set of electrical leads that couple the multi-chip module to a circuit board or the like in much the same way a conventional integrated circuit is connected. As compared to a conventional integrated circuit, the multi-chip module affords an increased level of integration, thereby providing greater functionality at a lower cost.

In one sense, the multi-chip module, with its interconnected semiconductor chips and passive components, can be viewed as a small circuit board. On the other hand, since the multi-chip module is often one component of a larger circuit, the multi-chip module also can be viewed as a single device, not unlike a conventional integrated circuit. The dual nature of the multi-chip module raises issues concerning the manner in which the multi-chip module is tested. The multi-chip module manufacturer would prefer to view the multi-chip module as a circuit board. In this way, faulty semiconductor chips and faulty interconnections between chips can be detected by means of the Boundary-Scan test technique set forth in the IEEE Standard 1149.1, described in the publication *IEEE Standard Test Access Port and Boundary Scan Architecture,* published by the Institute for Electrical and Electronic Engineers, New York, New York (1990) herein incorporated by reference. However, the user of the multi-chip module is more likely to view the module merely as a component that is to be connected to other components on a circuit board which itself is tested using the Boundary-Scan test technique. From the user's perspective, the multi-chip module should appear as a "macro-device" that complies with the above-mentioned IEEE 1149.1 Boundary-Scan Standard.

Unfortunately, the IEEE 1149.1 Boundary-Scan Standard is not hierarchical. A collection of individual devices, each claiming to be Boundary-Scan-compliant (such as the semiconductor chips of a multi-chip module), cannot be interconnected such that the resultant macro-device is also Boundary-Scan-compliant. One reason is that the current IEEE 1149.1 Boundary-Scan standard requires that a Boundary-Scan-compliant component possess a single-bit bypass register. If a combination of interconnected semiconductor chips, each Boundary-Scan-compliant, were to be treated as a single macro-device, then the resultant macro-device effectively would possess a bypass register having as many bits as chips in the scan chain. This is a violation of the IEEE 1149.1 Standard. The inability of the multi-chip module to be Boundary-Scan-compliant both as a circuit board and a macro-device poses significant difficulties in terms of testing.

There is another reason why present day multi-chip modules have heretofore not been able to be Boundary-Scan-compliant as both a circuit board and a macro-device. A typical multi-chip module has at least one scan chain comprised of a plurality of serially-coupled Boundary-Scan registers, each associated with an input/output pin of a separate Boundary-Scan-compliant semiconductor chip of the module. Not every input/output pin of every Boundary-Scan-compliant semiconductor chip within the module serves as a primary input/output of the module. Thus, each internal input/output pin that does not serve as a primary input/output of the module is not visible (i.e., the state of the signal at that input/output pin is not directly observable) when the module is implemented as a macro-device in a larger circuit. By the same token, each Boundary-Scan register associated with a corresponding "invisible" internal input/output pin is not visible through any module primary input/output. For the module to be Boundary-Scan-compliant as a macro-device, the "invisible" internal Boundary-Scan registers must be maintained in a safe state and must not be treated as active Boundary-Scan registers at the multi-chip module level. To date it has not been possible to treat the invisible internal Boundary-Scan registers in this manner.

Thus, there is a need for a multi-chip module that can be rendered Boundary-Scan-compliant both as a circuit board and as a macro-device.

SUMMARY OF THE INVENTION

Briefly, in accordance with a preferred embodiment of the invention, there is provided a Boundary-Scan-compliant, multi-chip module that may be tested as a circuit board or as a single device using the Boundary-Scan test technique. The multi-chip module of the invention includes a plurality of selectively interconnected semiconductor chips. At least n of the semiconductor chips have a Boundary-Scan architecture and are coupled in a Boundary-Scan chain. Each chip includes a Test Data Input (TDI) for receiving each of a successive one of a stream of bits of test information to be shifted therethrough, and a Test Data Output (TDO) at which each of the bits in the stream appears after shifting through the chip. To render the multi-chip module Boundary-Scan-compliant, the module includes a bypass circuit associated with at least n−1 of the n semiconductor chips in the Boundary-Scan chain for causing the TDI input of each of the n−1 chips to be short-circuited directly to its TDO output during selected intervals.

During the interval that each of the n−1 chips has its TDI effectively short-circuited to its TDO, the bits in the stream of test information thus effectively bypass each of the n−1 chips and is shifted only through a single chip in the Boundary-Scan chain. In this way, the n chips in the Boundary-Scan chain effectively appear as a single chip having a single-bit bypass register so that the multi-chip module appears as a macro-device that is Boundary-Scan-compliant. During intervals other than the selected intervals, the bypass circuit allows the bits in the stream of test information to be shifted through each chip in the chain so that the multi-chip module can be tested as a circuit board using the Boundary-Scan testing technique.

To enable the multi-chip module to be Boundary-Scan-compliant as a macro-device, each internal Boundary-Scan register associated with an internal input/output of the module that is not visible through the module primary input/output is maintained in a safe state in one of two ways. First, the internal Boundary-Scan registers can be maintained in a safe state by the use of an internal register construct whereby safe values are determined via the Boundary-Scan description language so that such values are applied during testing. Alternatively, the Boundary-Scan registers may be reconfigured so that during testing only those registers that are each visible through a separate module primary input/outputs are active.

DETAILED DESCRIPTION

Figure 1:
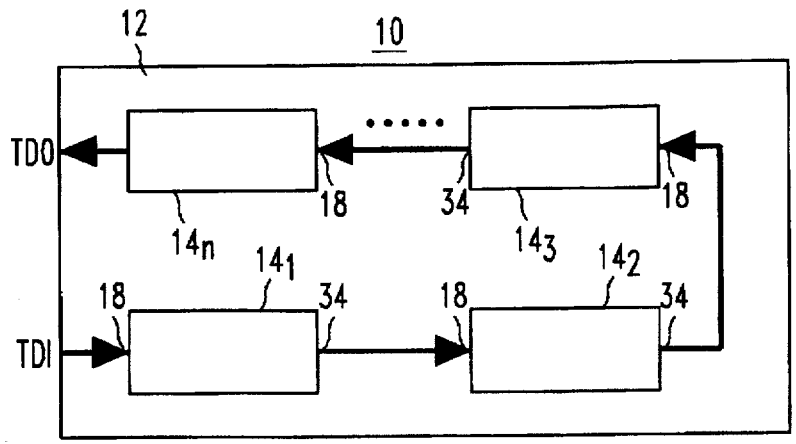
FIG. 1 shows a multi-chip module in accordance with the prior art.

FIG. 1 is a block schematic diagram of a multi-chip module 10 in accordance with the prior art. The module 10 comprises a substrate 12 (e.g., ceramic) that mounts a plurality of semiconductor chips $14_1, 14_2, 14_3 \ldots 14_n$, where n is an integer, each chip having a Boundary-Scan architecture as will be better described with respect to FIG. 2. The substrate 12 also may mount one or more passive components (not shown) and/or one or more semiconductor chips (not shown) that lack a Boundary-Scan architecture. Associated with the multi-chip module 10 is a set of electrical leads (not shown), each selectively coupled to one or more of the chips $14_1$–$14_n$, (and to the passive components and/or non-Boundary-Scan semiconductor chips, when present) for connecting the module to a larger circuit (not shown).

Figure 2:
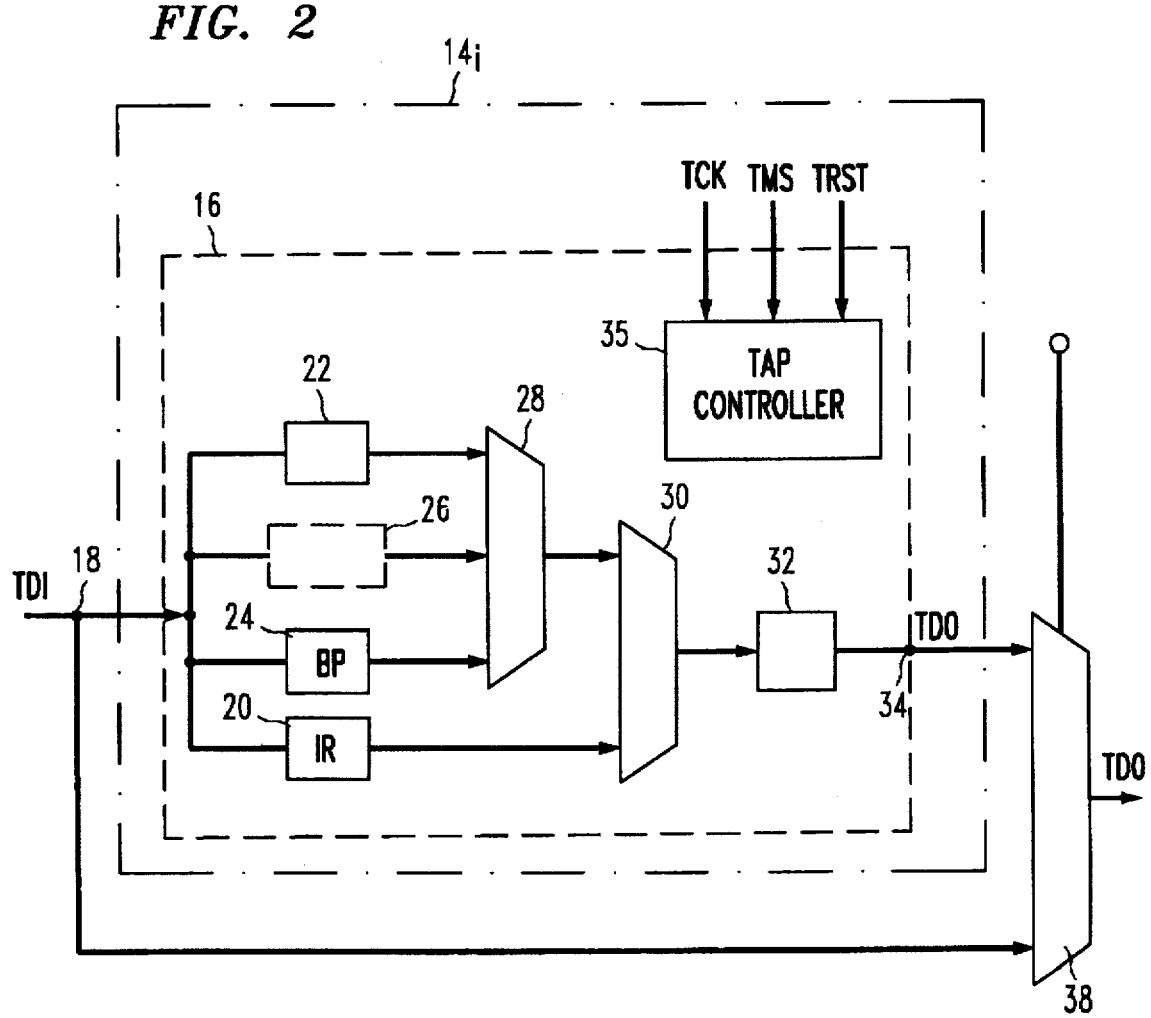
FIG. 2 is block schematic diagram of a portion of the module of FIG. 1 showing a first embodiment of a bypass circuit in accordance with the invention.

Referring to FIG. 2, there are shown the details of an exemplary semiconductor chip $14_i$ of the module 10 where i is an integer <n. The chip $14_i$ includes a Boundary-Scan circuit 16 designed to afford the chip a Boundary-Scan architecture to enable testing in accordance with the IEEE 1149.1 Standard (herein incorporated by reference). The Boundary-Scan circuit 16 has a Test Data Input 18 (TDI) at which successive bits in a stream of test information (e.g., test data or instructions) are applied. The TDI 18 is coupled to a first register 20, designated as the instruction register, for storing test instructions which control Boundary-Scan testing. The Boundary-Scan circuit 16 also includes a Boundary-Scan register 22 which is coupled to the TDI 18 and serves to store a value indicative of the state of at least one input/output (not shown) of the chip $14_i$. Also, the TDI 18 is coupled to a single-bit register 24 that functions as a bypass register for holding a single bit of information that is to bypass the registers 20 and 22. Although not required for Boundary-Scan compliance, the circuit 16 typically includes a fourth register 26, designated as the ID register, for storing a stream of bits identifying the semiconductor chip $14_i$.

The Boundary-Scan register 22, the bypass register 24, and the ID register 26 have their outputs coupled to a separate one of a set of inputs of a multiplexer 28. The multiplexer 28 has its output coupled to the first input of a second multiplexer 30 that is supplied at its second input with the output of the instruction register 20. A synchronization flip-flop is coupled to the buffer 32 output of the multiplexer 30 and serves to synchronize the multiplexer output signal to the failing edge of a clock signal TCK (not shown) as is required by the Boundary-Scan standard. The output of the flip-flop 32 functions as a Test Data Output (TDO) 34 of the circuit 16 at which successive bits in the stream of test information appear after the bits have been shifted through the circuit 16.

Referring to FIG. 1, the TDO 34 of each of the chips $14_1, 14_2 \ldots 14_{n-1}$ is coupled to the TDI 18 of a separate one of the chips $14_2, 14_3 \ldots 14_n$, respectively, establishing a Boundary-Scan whose TDI and TDO are formed by the TDI 18 and TDO 34 of the chips $14_1$ and $14_n$, respectively. In this way, test instructions and test data can be shifted through the Boundary-Scan chain of chips $14_1$–$14_n$ by applying the information to the TDI 18 of the first chip (i.e., chip $14_1$) in the chain which forms the TDI of the module 10. The TDO 34 of the last chip (i.e., chip $14_n$) forms the TDO of the module 10.

Referring to FIG. 2, control of the registers 20–26 and the multiplexers 28 and 30 is accomplished by a Test Access Port (TAP) controller 35 responsive to a Test Mode Select (TMS) signal, the Test Clock (TCK) signal and a Test Reset (TRST) signal (not shown) supplied to the Boundary-Scan circuit 16 from an external source. The structure of the TAP CONTROLLER 35, and the manner by which it controls Boundary-Scan testing, are fully described in the aforementioned IEEE publication *IEEE Standard Test Access Port and Boundary Scan Architecture*, herein incorporated by reference.

The chips $14_1$–$14_n$ of FIG. 1, coupled in the manner described, can be tested by the Boundary-Scan test technique described in the aforementioned IEEE 1149.1 Standard in the same way a conventional circuit board is tested. However, when the multi-chip module 10 is used as a component within a larger circuit (not shown), it is desirable to have the aggregation of semiconductor chips $14_1$–$14_n$ appear as a single macro-device that is Boundary-Scan-compliant.

As discussed at the outset, there are reasons why a set of devices (i.e., the chain of semiconductor chips $14_1$–$14_n$), which themselves are each compliant with the IEEE Standard 1149.1, are non-compliant in the aggregate. To be compliant with the IEEE 1149.1 Standard, a device must possess a single-bit bypass register that permits a bit to be shifted between the TDI and TDO of the device without accessing other registers. As may be appreciated, each of the chips $14_1$–$14_n$ in the Boundary-Scan of FIG. 1 has its own single-bit bypass register 24 (see FIG. 2). Thus, the resultant chain of chips $14_1$–$14_n$, when viewed as a macro device, effectively possesses a bypass register containing as many bits as chips, a violation of the standard.

There is another reason the chain of semiconductor chips $14_1$–$14_n$, each individually Boundary-Scan-compliant, is not Boundary-Scan-compliant in the aggregate. During Boundary-Scan testing, there are certain test instructions (i.e., opcode patterns) that not only select the Boundary-Scan register 22 of FIG. 2 but also select certain cells (not shown) associated with the Boundary-Scan register that control internal nodes within the multi-chip module between chips $14_1$–$14_n$. The device-level analogy of these cells is a set of cells within the Boundary-Scan register 22 itself for controlling and/or observing its internal logic. Such cells are specifically prohibited by the IEEE 1149.1 standard.

In accordance with one aspect of the invention, the chips $14_1$–$14_n$ of the module 10 of FIG. 1 are rendered Boundary-Scan-compliant alternately as a circuit board and as a macro-device by means of a bypass circuit 36 (see FIG. 2) associated with at least n–1 of the chips, such as the chip $14_i$. As will be described, the bypass circuit 36 effectively short-circuits the TDI 18 to the TDO 34 of each of the n–1 chips associated with the bypass circuit for permitting certain test instructions to bypass the Boundary-Scan circuit 16 of FIG. 2 in each of the n–1 chips.

In the embodiment shown in FIG. 2, the bypass circuit 36 includes a two-input multiplexer 38 associated with each of n–1 of the chips $14_1$–$14_n$, such as the chip $14_i$, for effectively short-circuiting the TDI 18 to the TDO 34 of that chip. To accomplish such short-circuiting, the multiplexer 36 within each such chip has its first and second inputs coupled to the TDI 18 and TDO 34, respectively, of its associated chip, with the output of the multiplexer serving as the TDO for the chip. The multiplexer 38 is operative to pass the signal at a separate one of its inputs to its output (i.e., the new TDO for the chip) in response to the state of a control signal applied to the multiplexer. The control signal for the multiplexer 38 is a function of both the contents of the instruction register, 20 and the state of an externally generated signal BCE (not shown). The BCE signal is supplied from an external source, such as a test controller (not shown), to signal the multi-chip module 10 of FIG. 3 whether the module is to be Boundary-Scan-compliant as a circuit board or as a macro-device during Boundary-Scan testing.

During the interval when the chips $14_1$–$14_n$ are to be Boundary-Scan-compliant as a macro-device, thus allowing certain test information to bypass n–1 of the n chips, then the control signal applied to the multiplexer 38 associated with each of n–1 of the chips is forced to a logic "0" state. Consequently, the multiplexer 38 associated with each of the n–1 of the chips passes the signal at the TDI 18 of its associated chip (e.g., chip $14_i$) to the output of the multiplexer. Thus, the test information present at the TDI 18 of each of these n–1 chips $14_1$–$14_n$ of FIG. 1 effectively bypasses the Boundary-Scan circuit 16 (see FIG. 2) within that chip.

Conversely, when the test information is to be shifted through each of the n chips $14_1$–$14_n$, then the control signal applied to each multiplexer 38 is forced to a logic "1" level. In this way, the multiplexer 38 associated with each of the n–1 chips $14_1$–$14_n$ passes the signal at the TDO 34 (see FIG. 2) of each chip to the multiplexer output. As may be appreciated, during the interval that each of the n–1 chips has its TDI 18 and TDO 34 short-circuited, then only one of the n chips $14_1$–$14_n$, (see FIG. 1) in the Boundary-Scan chain will have its one-bit bypass register 22 of FIG. 2 active within the chain. This is exactly the desired state of affairs when the multi-chip module 10 is to be tested as a macro-device.

The bypass circuit 36 of FIG. 2, (i.e., the multiplexer 38 associated with each of n–1 of the chips $14_1$–$14_n$) affords a simple and economical approach to effectively deactivate the bypass register 24 (see FIG. 2) of each of the n–1 chips during selected intervals. However, the multiplexer 38 forming the bypass circuit 36 introduces a certain propagation delay in the Boundary-Scan chain formed by the chips $14_1$–$14_n$. Depending on the size of n (i.e., the number of chips $14_1$–$14_n$), the delay may be unacceptable.

Figure 3:
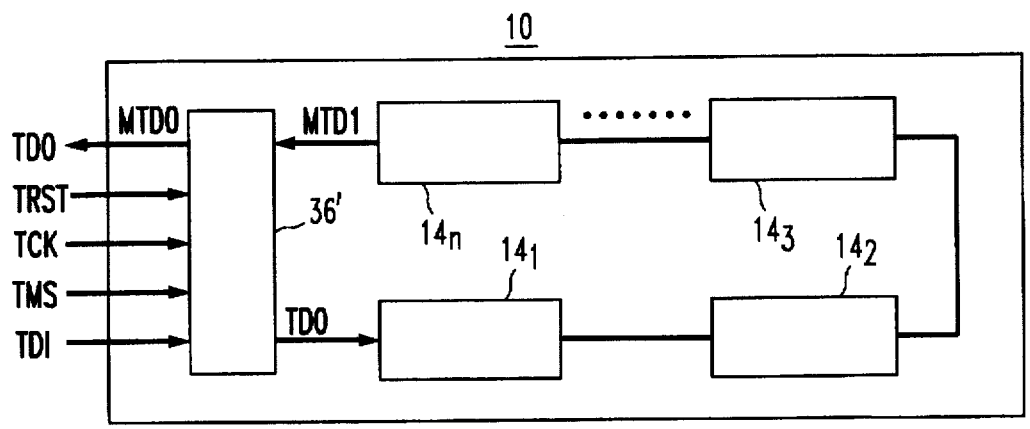
FIG. 3 is block schematic diagram of a multi-chip module showing a second preferred embodiment of a bypass circuit in accordance with the invention.
Figure 4:
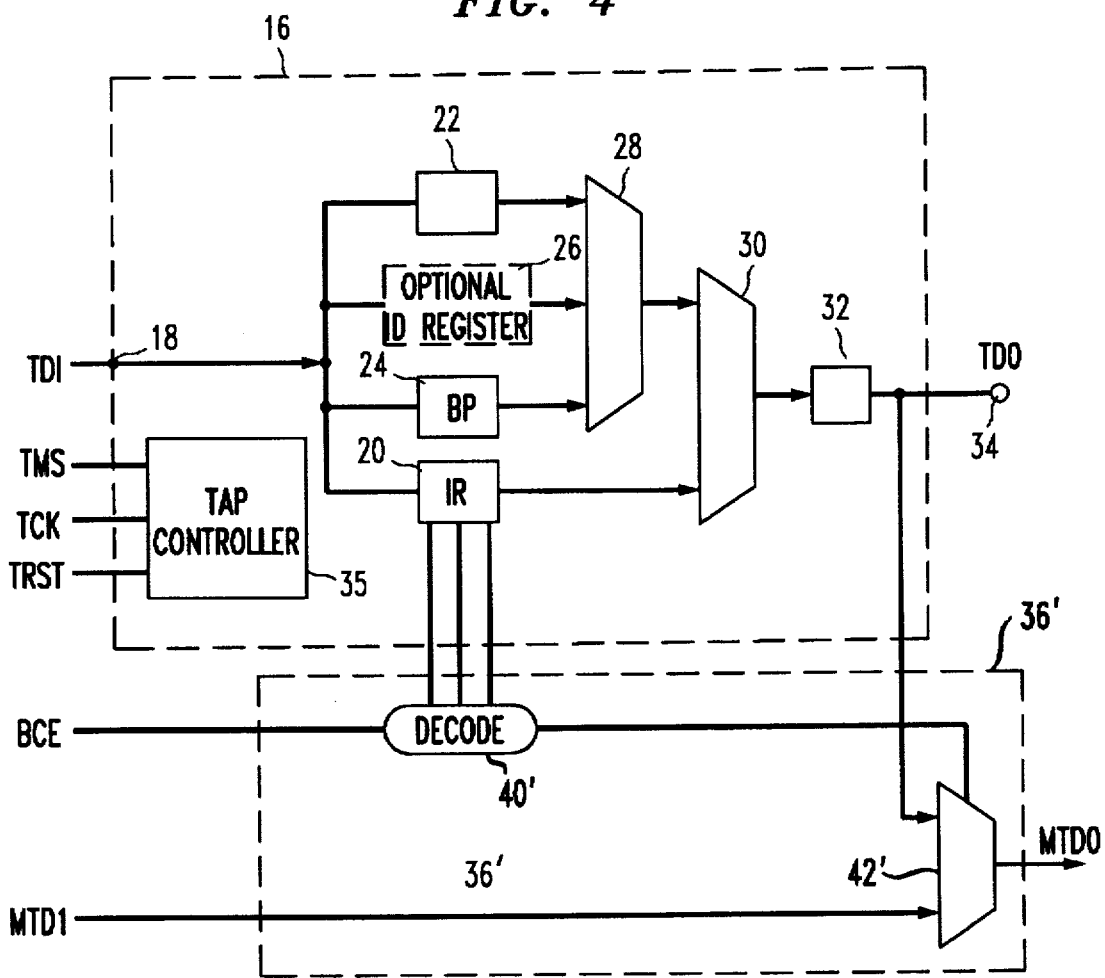
FIG. 4 is a block schematic diagram of the bypass circuit of FIG. 3.

Referring to FIG. 3, the module 10 may advantageously be provided with a bypass circuit 36', in accordance with a second preferred embodiment of the invention, for bypassing all of the n chips $14_1$–$14_n$ during selected intervals without undue propagation delays. The bypass circuit 36' of FIG. 3 takes the form of a separate die (i.e., device) carried by the module 10 besides the chips $14_1$–$14_n$. As best seen in FIG. 4, the bypass circuit 36' includes a Boundary-Scan circuit 16 just like the Boundary-Scan circuit 16 of FIG. 2 associated with the chip $14_i$. Accordingly, like numerals have been used in FIG. 4 to identify like elements in FIG. 2. The bypass circuit 36' thereby complies with the IEEE 1149.1 Standard, just like each of the chips $14_1$–$14_n$ of FIG. 3 with one important exception. The Boundary-Scan register 22 of the circuit 16 of FIG. 4 comprises a single-bit internal register, rather than a multi-bit register as is the case with the chips $14_1$–$14_n$.

Unlike the semiconductor chip $14_i$ of FIGS. 1 and 3, the bypass circuit 36' includes a decoder 40' and a multiplexer 42'. The decoder 40' is responsive to the contents of the instruction register 20 in the Boundary-Scan circuit 16 of the bypass circuit 36' and is also responsive to the BCE signal as well as to control signals from the TAP controller 35 in the Boundary-Scan circuit.

The multiplexer 42' has a first input coupled to the TDO 34 of the Boundary-Scan circuit 16 within of the bypass circuit 36'. The multiplexer 42' has a second input coupled to an input of the bypass circuit 36' that establishes a Module Test Data Input (MTDI) which is coupled to the TDO 34 of the last semiconductor chip (i.e., chip $14_n$) in the chain of chips $14_1$–$14_n$, of the module 10 of FIG. 3. Referring to FIG. 4, the output of the multiplexer 42' forms a Test Data Output of the module 10 of FIG. 3 and thus bears the designation MTDO.

During intervals that the module 10 of FIG. 1 is to be Boundary-Scan-compliant as a circuit board (as occurs when BCE is at a logic "1" level), then the decoder 40' controls the multiplexer 42' to cause the multiplexer to pass the signal at the MTDI to the MTDO. In this way the TDO 34 of the last chip (i.e., chip $14_n$) in the Boundary-Scan chain of chips $14_1$–$14_n$ of FIG. 3 is coupled to the MTDO (i.e., the Test Data Output (TDO) of the multi-chip module 10). Under both these conditions, the chain of Boundary-Scan devices associated with on the module 10" is formed by the combination of the semiconductor chips $14_1$–$14_n$ and the bypass circuit 36'.

The bypass circuit 36' of FIG. 4 causes the module 10 of FIG. 3 to be Boundary-Scan-compliant as a macro device when two conditions are present. First, the level of the BCE signal must be a logic "0" level. Secondly, a certain type of test instruction (i.e., a BYPASS, IDCODE/USERCODE, HIGHZ or CLAMP instruction as described in the IEEE 1149.1 Standard) must be present in the instruction register 20. Under these conditions, the decoder 40' causes the multiplexer 42' to pass the signal from the output buffer 32 to the MTDO, which, as indicated, forms the TDO of module 10 of FIG. 3. Thus, the signal at the TDI 18 of the Boundary-Scan circuit 16 of FIG. 4 passes directly to the MTDO, thereby bypassing the Boundary-Scan chain of chips $14_1$–$14_n$ of FIG. 3.

Figure 5:
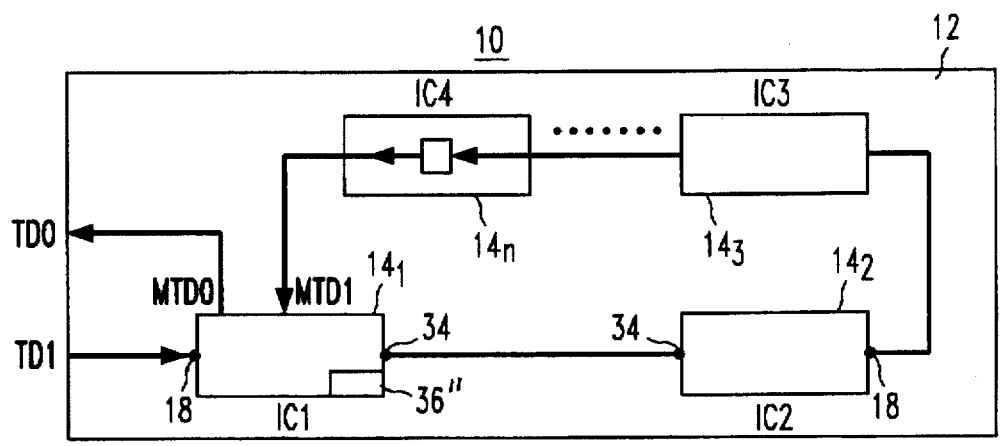
FIG. 5 is a block schematic diagram of a multi-chip module including a third preferred embodiment of a bypass circuit in accordance with the invention.
Figure 6:
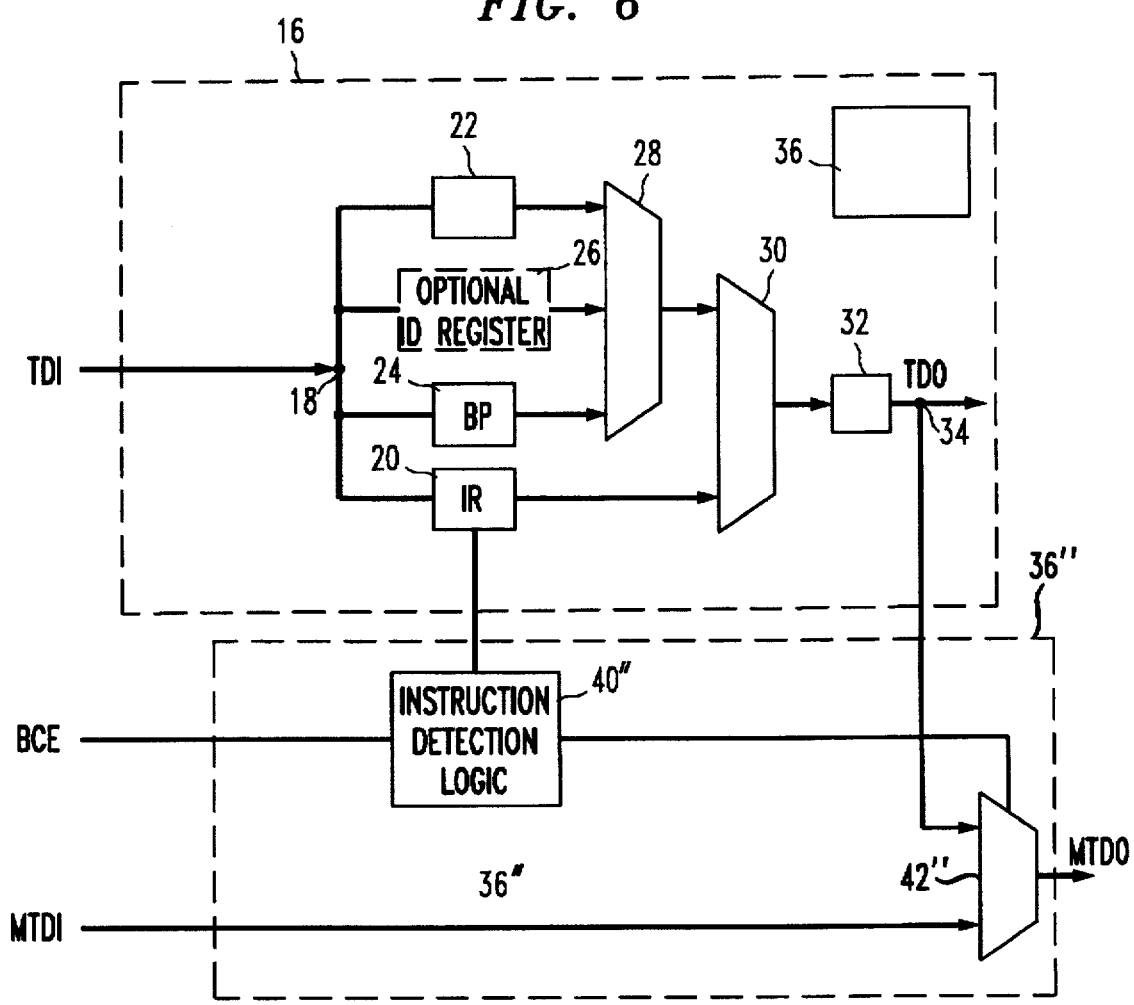
FIG. 6 is a block schematic diagram of a semiconductor chip comprising part of the multi-chip module of FIG. 5.

Referring now to FIG. 5, there is shown a multi-chip module 10 that incorporates bypass circuit 36" in accordance with third embodiment of the invention. Unlike the module 10 of FIG. 3 whose bypass circuit 36' comprises a chip separate from the chips $14_1$–$14_n$, the bypass circuit 36" of FIG. 5 is included within the first chip (i.e., chip 14 1 ) closest to the TDI of the module. As seen in FIG. 6, the chip $14_1$ includes a Boundary-Scan circuit 16 similar to the Boundary-Scan circuits shown in FIGS. 2 and 4 except that the optional register 26 is not shown in the Boundary-Scan circuit of FIG. 6. Like numerals have been used in FIG. 6 to depict like elements.

The bypass circuit 36" of FIG. 6 includes an instruction detection logic circuit 40" and a multiplexer 42". The instruction detection logic circuit 40" (described in greater detail with respect to FIGS. 7 and 8) is responsive both to the BCE signal and to information contained in the instruction register 22 as well as to control signals from the TAP controller 35. The multiplexer 42" has a first input coupled to the TDO 34 of the Boundary-Scan circuit 16 of FIG. 6, and a second input coupled to an input, designated MTDI, that is connected to the TDO of the last chip (i.e., chip $14_n$) of the chain of chips $14_1$–$14_n$ of FIG. 5. The output of the multiplexer 42, designated as MTDO, forms the TDO of the module 10 of FIG. 5.

Depending on the state of its various input signals, the instruction detection logic circuit 40" causes the multiplexer 42" to pass the signal at a separate one of its inputs to its output. During the interval that the BCE signal is at a logic "1," and in the absence of certain instructions in the instruction register 20, the instruction detection logic circuit 40" causes the multiplexer 42" to pass the signal received at its MTDI to its MTDO. In this way, test information can be shifted between the TDI and TDO of the module 10 of FIG. 5 through the chips $14_1$–$14_n$.

When the BCE signal is at a logic "0," and when a BYPASS class of instructions (BYPASS CLAMP, HIZ, USERCODE/IDCODE) is detected in the instruction register 20, then the instruction detection logic circuit 40" causes the multiplexer 42" to pass the signal at the TDO 34 of the logic circuit 16 of FIG. 6 to the MTDO. Under these conditions, a stream of test information shifted into the TDI of the module 10 of FIG. 5 will only be shifted through the semiconductor chip $14_1$, effectively bypassing the chips $14_2$–$14_n$. Thus, the module 10 of FIG. 6 now appears as a single device, rather than a chain of devices.

Figure 7:
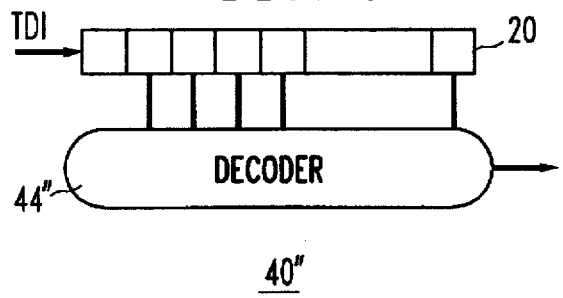
FIG. 7 is a block schematic diagram of a first embodiment of an Instruction Detection Logic circuit comprising part of the semiconductor chip of FIG. 6.

Referring to FIG. 7, the instruction detection logic circuit 40" may advantageously be configured of a decoder 44 that can detect the presence in the instruction register 20 of not only a BYPASS instruction, but a CLAMP and a HIGHZ, IDCODE/USERCODE test instruction. The presence of any one of these instructions, in combination with a logic "0" level BCE signal, will cause the decoder 44" to generate a control signal, causing the multiplexer 42" of FIG. 6 to pass the signals at the TDO 34 of the chip $14_1$ to the (MTDO).

Figure 8:
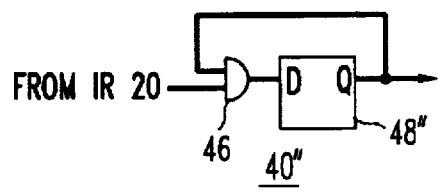
FIG. 8 is a block schematic diagram of a second embodiment of the Instruction Detection Logic circuit of PIG. 7.

In the event that only the presence of the BYPASS signal is of concern, then the instruction detection logic circuit 40" may be configured of the combination of a two-input AND gate 46" and a D-type flip-flop 48" as seen in FIG. 8. The AND gate 46" has a first input coupled to the instruction register 20 of FIG. 6 to receive test instructions applied to the TDI input of the chip $14_1$ of FIG. 6 and stored in the register 46". The AND gate has its output coupled to the D input of the flip-flop 48" whose output is coupled back to the second input of the AND gate.

The combination of the AND gate 46" and the flip-flop 48" forms a single-bit register having the capability of "remembering" the presence of zero in the instruction stream received by the instruction register 20 of FIG. 5. The presence of a zero in the instruction stream is an indicator that an instruction other than a BYPASS instruction is present. As a consequence, a logic "0" now appears at the output of the flip-flop 48". When a logic "0" level signal is present at the output of flip-flop 48", the multiplexer 42" of FIG. 6 couples the TDO 34 of the chip $14_1$ directly to the MTDO, effectively including all of the chips $14_2$–$14_n$ in the Boundary-Scan chain.

Although not shown, the bypass circuit could be implemented in the last chip in the Boundary-Scan chain (i.e., chip $14_n$) rather than being implemented in the first chip in the chain (i.e., chip $14_1$) as thus described with respect to FIGS. 5 and 6. The disadvantage with implementing the bypass circuit within the chip $14_n$ is that this approach does not afford the flexibility of monitoring the entire instruction stream, as is possible when the bypass circuit is implemented in the chip $14_1$. However, by implementing the bypass circuit 36" in the last chip $14_n$, the need for a separate port for the MTDO is eliminated.

Figure 9:
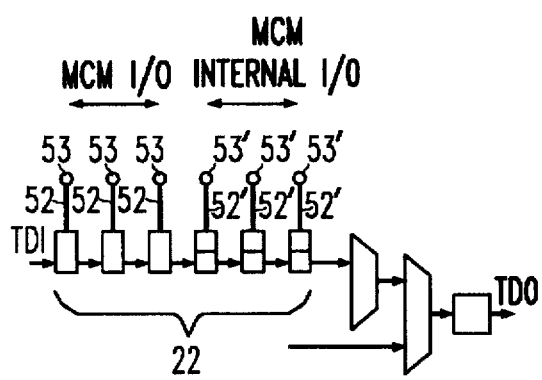
FIG. 9 is a block schematic diagram of a first embodiment of the Boundary-Scan register for use with the multi-chip module of the invention.

In accordance with another aspect of the invention, it would be desirable to provide the module 10 with a module-level Boundary-Scan register 22, a first embodiment of which is shown in FIG. 9. As seen in FIG. 9, the Boundary-Scan register 22 includes a plurality of "external" single-bit register elements 52 (each configured the same) and a plurality of "internal" register elements 52' (each configured the same). The elements 52 are denominated by the term "external," as each element is coupled to a separate primary or external input/output 53 of the module 10 of FIG. 1. In contrast, each element 52' is denominated as an "internal" element because each is coupled to an input/output 53' of a separate one of the chips $14_1$–$14_n$ (see FIG. 1) which does not serve as a primary input/output of the module 10 of FIG. 1.

Figure 10:
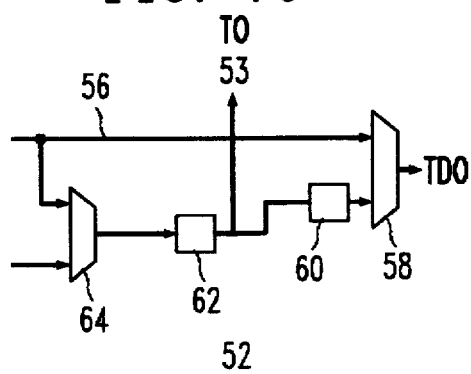
FIG. 10 is a block schematic diagram of an active cell within the Boundary-Scan register of FIG. 9.

As best seen in FIG. 10, each external element 52 includes a line 56 carrying the signal present at the TDI of the element to a first input of a first multiplexer 58 whose output forms the TDO of the element. The second input to the multiplexer 58 is coupled to a register cell 60, denominated as an update register cell, as it serves to hold an updated value received from a register cell 62 which is coupled in to the update register cell as indicated by the dashed line. The register cell 62 is referred to as a shift register, as it stores a value shifted into the cell from a multiplexer 64 having a first input coupled to the TDI line 56. The second input of the multiplexer 64 is supplied with a fixed logic value (typically, a logic high or "1" value).

In addition to controlling the value present at the update register 60, the register cell 62 controls the logic value provided by the cell 52 to a corresponding module primary input/output 53. The signal provided by the register cell 62 corresponds to the signal present at the output of the multiplexer 64, which will either be the signal on the TDI line 56 or the fixed input signal at the second input of the multiplexer, depending on the state of the multiplexer control signal. Just as the multiplexer 64 controls the signal present at the module input/output 53, the multiplexer 58 controls the signal present at the TDO of the register element 52. The multiplexer 58 will pass the signal from either the update register 60 (as provided by the register 62), or the signal on the TDI line 56, to the TDO of the cell.

Figure 11:
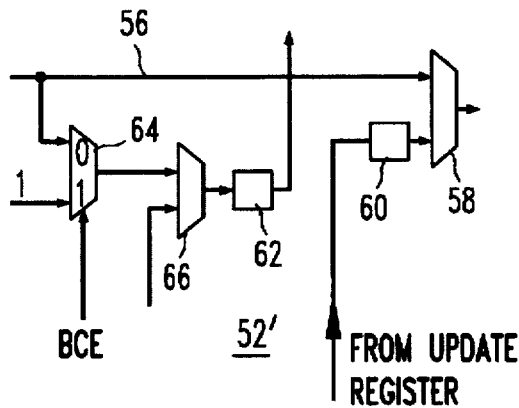
FIG. 11 is a block schematic diagram of an "inactive" cell within the Boundary-Scan register of FIG. 9.

Referring to FIG. 11, there is shown a block schematic diagram of one of the internal elements 52 when the multi-chip module is configured as a device. The internal element 52' of FIG. 11 is identical in many respects to the element 52 of FIG. 10, and, therefore, like numbers have been used to describe like elements. There are however two distinct differences between the internal element 52' of FIG. 11 and the external element 52 of FIG. 10. First, the internal element 52' is logically devoid of any connection between the register cells 60 and 62, in contrast to the connection therebetween in the element 52 of FIG. 10, as indicated by the dashed line in that figure. Secondly, the internal element 52' of FIG. 11 includes a multiplexer 66 interposed between the output of the multiplexer 64 (which is controlled by the signal BCE) and the register 62. The multiplexer 66 has its first input supplied with the output of the multiplexer 64 and its second input signal supplied with a prescribed "safe" value. In this way, the register 62 is provided with either the prescribed safe value or with the output of the multiplexer 64, depending on the state of the control signal applied to the multiplexer 66.

By configuring the Boundary-Scan register 22 as shown in FIG. 9, each internal module input/output 53' can be maintained in a safe state by appropriately configuring (i.e., disguising) the corresponding one of the elements 52' in the manner shown in FIG. 11. Each internal element 52' is controlled to capture a constant value and to inhibit the shift value (i.e., the value stored by the register 62) from being updated. A knowledge which the cells 52' need to be so disguised in this manner can be obtained from the multi-chip module design.

Figure 12:
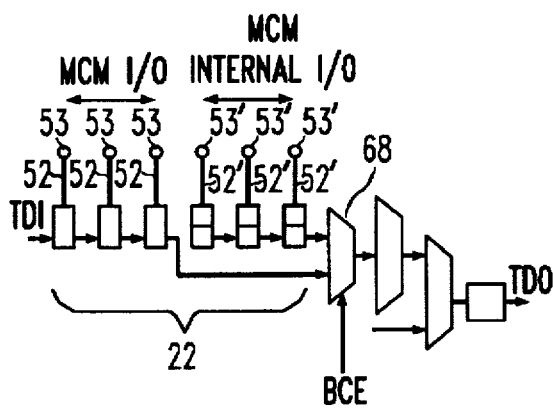
FIG. 12 is a block schematic diagram of a second embodiment of a Boundary-Scan register for the multi-chip module of the invention.

Referring now to FIG. 12, there is shown a second embodiment of module-level Boundary-Scan register 22. Like the Boundary-Scan register 22, the register of FIG. 12 includes both external and internal cells 52 and 52'. However, unlike the previous embodiment, the internal cells 52' are not retained as part of the Boundary-Scan register. The cells 52' are configured as seen in FIG. 11. As seen in FIG. 12, the internal cells 52 can be effectively bypassed by way of a multiplexer 68, leaving only the external cells 52 in the Boundary-Scan chain that runs between the register TDI and TDO. However, the internal cells still need to be maintained in a safe state, using, for example, the technique shown in FIG. 11.

The foregoing describes a multi-chip module 10 capable of being rendered Boundary-Scan-compliant, both as a circuit board and as a macro device, by way of a bypass circuit 36, 36' or 36" so as to effectively short the TDI to the TDO of at least n−1 Boundary-Scan architecture chips 14$_1$–14$_n$ of the module.

We claim:

1. A multi-chip module having external inputs/outputs and being Boundary-Scan compliant both as a circuit board and as a macro device, comprising:

n semiconductor chips (where n is an integer), each of said chips having inputs/outputs, some of which form said external inputs/outputs of said module, said chips each having a Boundary-Scan architecture and coupled in a Boundary-Scan chain, each of said chips including a Test Data Input (TDI) and a Test Data Output (TDO), a first one of said chips in the chain receiving a stream of test information bits at its TDI via a TDI associated with the module for shifting through the chain, a last one of said chips in the chain shifting out slid stream of test information bits from its TDO to a TDO associated with the module, and each of said chips in the chain other than said first and said last chips having its TDO coupled to the TDI of a downstream chip;

a bypass circuit associated with at least n−1 of said chips for causing the stream of test information bits to be bypassed directly from the TDI to the TDO of each of n−1 of said chips during selected intervals so that said chips collectively appear as a single Boundary-Scan-compliant macro device during said selected intervals, including:

a Test Data Input (TDI) forming the TDI associated with the module for receiving said stream of test information bits for selected transmission to the chain of said chips;

an instruction register for storing an instruction contained within the stream of test information bits applied to the TDI of the bypass circuit (which also forms the TDI associated with the module);

a bypass register for storing a bit of information contained in said stream of test information bits;

a Test Data Output (TDO) at which information contained in one of said instruction and bypass registers is selectively supplied to the TDI of a first one of said chips in the chain;

a multiplexer having a first input coupled to the TDO of the bypass circuit and a second input coupled to the TDO of a last one of said chips in the chain, the multiplexer passing a signal at a separate one of its inputs to its output (which serves as a Test Data Output (TDO) for the module) in response to a control signal applied to the multiplexer; and a decoder for generating the control signal for the multiplexer in accordance with the instruction contained in the instruction register circuit and in accordance with the state of a Boundary-Scan compliance enable signal supplied to the decoder to establish whether the module is to be Boundary-Scan-compliant as a macro-device or a circuit board and;

a module-level Boundary-Scan register having a first plurality of register elements each associated with one of said external inputs/outputs of the module and a second plurality of register elements each associated with one of said inputs/outputs that does not form an external input/output of said module, each of said second register elements being controllable for setting to a safe value during testing.

2. The module according to claim 1 wherein the bypass circuit includes n−1 multiplexers associated with n−1 of said chips, respectively, each multiplexer having a first input coupled to the TDI of an associated one of n−1 of said chips and a second input coupled to the TDO of an associated one of n−1 of said chips for passing a signal present at a separate one of said inputs of said multiplexer to its output, the output being coupled to the TDI of a downstream one of n−1 of said chips.

3. The module according to claim 1 wherein the bypass circuit is integral with one of said chips in the chain which has its TDI closest to the TDI associated with the module.

4. The module according to claim 1 wherein each external register element comprises:

a first multiplexer supplied at a first input with a fixed logic value and supplied at a second input with a test data input value, said first multiplexer selectively passing a separate one of the values at its inputs to a multiplexer output;

a first register cell supplied with a value appearing at the output of the first multiplexer for passing said value to one of said external module inputs/outputs;

a second multiplexer having a first input supplied with the test data input value and a second input, the second multiplexer selectively passing the value at its first and second inputs to an output of said second multiplexer; and a second register cell supplied with the value passed by the first register cell for passing said value to the second input of said second multiplexer.

5. The module according to claim 1 wherein each internal register element comprises:

a first multiplexer supplied at a first input with a fixed logic value and supplied at a second input with a test data input value for selectively passing a separate one of the input values to a multiplexer output;

a first register cell supplied with a value at the output of the multiplexer for passing said value to an external module input/output;

a second multiplexer having a first input supplied with the test data input value and a second input supplied, for selectively passing the value at its first and second inputs to an output of said second multiplexer; and a second register cell supplied with an update value for passing said value to the second input of said second multiplexer.

* * * * *